(12) United States Patent
Bolotin

(10) Patent No.: US 6,591,486 B1
(45) Date of Patent: Jul. 15, 2003

(54) MANUFACTURING AND CARRIER SYSTEM WITH FEEDER/PROGRAMMING/BUFFER SYSTEM

(75) Inventor: Lev M. Bolotin, Kirkland, WA (US)

(73) Assignee: Data I/O Corporation, Redmond, WA (US)

(*) Notice: Subject to any disclaimer, the term of this patent is extended or adjusted under 35 U.S.C. 154(b) by 43 days.

(21) Appl. No.: 09/419,162

(22) Filed: Oct. 15, 1999

(51) Int. Cl.$^7$ .................................................. H05K 3/30
(52) U.S. Cl. ............................ 29/740; 29/743; 414/225
(58) Field of Search ..................... 29/740, 743; 414/225

(56) References Cited

U.S. PATENT DOCUMENTS

| | | | |
|---|---|---|---|
| 4,775,277 A | 10/1988 | Zeleny | 414/121 |
| 4,819,178 A | 4/1989 | Isayama et al. | 364/481 |
| 5,870,820 A | * 2/1999 | Arakawa et al. | 29/740 |
| 5,896,652 A | * 4/1999 | Tagata et al. | 29/740 |

FOREIGN PATENT DOCUMENTS

EP 08002685 6/1994 .......... B65G/60/00

OTHER PUBLICATIONS

BP–6500 In–Line Programming System brochure, BP Microsystems, Inc. 1999, 2 pages.
BP–6500 In–Line Programming System Data Sheet, BP Microsystems, Inc. 1999, 1 page.
"BP–6500 In–Line Programming & Fifth Generation Technology", BP Microsystems, Inc. 1999, 7 pages.

* cited by examiner

Primary Examiner—Richard Chang
(74) Attorney, Agent, or Firm—Mikio Ishimaru

(57) ABSTRACT

A circuit board manufacturing system is provided which includes a production assembly line with a carrier handling system for a plurality of feeder/programming/buffer systems. The feeder/programming/buffer system has a flexible feeder mechanism for s receiving unprogrammed device in a number of different manners, a programming mechanism for performing a programming operation on the unprogrammed devices at a high rate of speed, and a buffer mechanism for providing the programmed micro devices to the carrier handling system. The carrier handling system has its own buffer section and is integrated with an assembly handling system of the production assembly line to populate the programmed devices on to the circuit boards.

30 Claims, 2 Drawing Sheets

MANUFACTURING AND CARRIER SYSTEM WITH FEEDER/PROGRAMMING/BUFFER SYSTEM

CROSS-REFERENCE TO RELATED APPLICATION(S)

The present application contains subject matter related to a concurrently filed U.S. Patent Application by Lev M. Bolotin entitled "MANUFACTURING SYSTEM WITH FEEDER/PROGRAMMING/BUFFER SYSTEM". The related application is assigned to Data I/O Corporation, is identified by Ser. No. 09/418,732, now U.S. Pat. No. 6,532,395 B1, and is hereby incorporated by reference.

The present application contains subject matter related to a concurrently filed U.S. Patent Application by Bradley M. Johnson, Lev M. Bolotin, Simon B. Johnson, Carl W. Olson, Bryan D. Powell and Janine Whan-Tong entitled "FEEDER/PROGRAMMING/BUFFER OPERATING SYSTEM". The related application is assigned to Data I/O Corporation, is identified by Ser. No. 09/419,172, now U.S. Pat. No. 6,449,523 B1, and is hereby incorporated by reference.

The present application also contains subject matter related to a concurrently filed U.S. Patent Application by Simon B. Johnson, George L. Anderson, Lev M. Bolotin, Bradley M. Johnson, Mark S. Knowles, Carl W. Olson and Vincent Warhol entitled "FEEDER/PROGRAMMING/BUFFER CONTROL SYSTEM AND CONTROL METHOD". The related application is assigned to Data I/O Corporation, is identified by Ser. No. 09/418,901, and is hereby incorporated by reference.

TECHNICAL FIELD

The present invention relates generally to a manufacturing system for electronic products, and more particularly to production of electronic circuit boards incorporating programmable integrated circuits.

BACKGROUND ART

In the past, certain operations of electronic circuit board assembly were performed away from the main production assembly lines. While various feeder machines and robotic handling systems would populate electronic circuit boards with integrated circuits, the operations related to processing integrated circuits, such as programming, testing, calibration, and measurement were performed in separate areas on separate equipment rather than being integrated into the main production assembly lines.

For example, in the programming of programmable devices such as electrically erasable programmable read-only memories (EEPROMs) and Flash EEPROMs, separate programming equipment was used which was often located in a separate area from the circuit board assembly lines. There were a number of reasons why programming was done off-line.

First, the programming equipment was relatively large and bulky. This was because of the need to accurately insert and remove programmable devices at high speeds into and out of programming sockets in the programmer. Since insertion and removal required relatively long traverses at high speed and very precise positioning, very rigid robotic handling equipment was required. This rigidity requirement meant that the various components had to be relatively massive with strong structural support members to maintain structural integrity and precision positioning of the pick and place system moving at high speeds. Due to the size of the programming equipment and the limited space for the even larger assembly equipment, they were located in different areas.

Second, a single high-speed production assembly system could use up programmed devices faster than they could be programmed on a single programming mechanism. This required a number of programming systems which were generally operated for longer periods of time in order to have a reserve of programmed devices for the production assembly systems. This meant that the operating times and the input requirements were different between the two systems.

Third, no one had been able to build a single system which could be easily integrated with both the mechanical and electronic portions of the production assembly systems. These systems are complex and generally require a great deal of costly engineering time to make changes to incorporate additional equipment.

A major problem associated with programming the programmable devices in a separate area and then bringing the programmed devices into the production assembly area to be inserted into the electronic circuit boards was that it was difficult to have two separate processes running in different areas and to coordinate between the two separate systems. Often, the production assembly line would run out of programmable devices and the entire production assembly line would have to be shut down. At other times, the programming equipment would be used to program a sufficient inventory of programmed devices to assure that the production assembly line would not be shut down; however, this increased inventory costs. Further problems were created when the programming had to be changed and there was a large inventory of programmed integrated circuits on hand. In this situation, the inventory of programmable devices would have to be reprogrammed with an accompanying waste of time and money.

While it was apparent that a better system would be desirable, there appeared to be no way of truly improving the situation. There were a number of apparently insurmountable problems that stood in the way of improvement.

First, the operating speeds of current production assembly lines so greatly exceeded the programming speed capability of conventional programmers that the programmer would have to have a much greater throughput than thought to be possible with conventional systems.

Second, not only must the programmer be faster than existing programmers, it would also have to be much smaller. The ideal system would integrate into a production assembly line, but would do so without disturbing an existing production assembly line or requiring the lengthening of a new production assembly line over that of the length without the ideal system. Further, most of these production assembly lines were already filled with, or designed to be filled with, various types of feeding and handling modules which provide limited room for any additional equipment.

Third, any programmer integrated with the production assembly line would apparently also have to interface with the control software and electronics of the production system software for communication and scheduling purposes. This would be a problem because production assembly line system software was not only complex, but also confidential and/or proprietary to the manufacturers of those systems. This meant that the integration must be done with the cooperation of the manufacturers, who were reluctant to spend engineering effort on anything but improving their own systems, or must be done with a lot of engineering effort expended on understanding the manufacturers' software before working on the programmer's control software.

Fourth, the mechanical interface between a programmer and the production equipment needed to be highly accurate for placing programmed devices relative to the pick-and-place handling equipment of the production assembly system.

Fifth, there are a large number of different manufacturers of production handling equipment as well as production manufacturing equipment. This means that the a large number of different production assembly line configurations would have to be studied and major compromises in design required for different manufacturers.

Sixth, the ideal system would allow for changing quickly between different micro devices having different configurations and sizes.

Seventh, the ideal system needed to be able to accommodate a number of different micro device feeding mechanisms including tape, tube, and tray feeders.

Finally, there was a need to be able to quickly reject micro devices which failed during the programming.

All the above problems seem to render an effective solution impossible with the major problem being that the current state of this technology was such that it was not possible for programming equipment to keep up with the production line. Basically, it takes time to program an electronic device. A solution has been long sought for increasing the throughput of the integrated circuit programming systems.

DISCLOSURE OF THE INVENTION

The present invention provides a micro device product manufacturing system which includes a production assembly line with a plurality of feeder/processing/buffer systems and a carrier handling system. The feeder/processing/buffer system has a flexible feeder mechanism for receiving micro devices in a number of different manners, a processing mechanism for performing a processing operation on the micro devices at a high rate of speed, and a buffer mechanism for providing the processed micro devices to the carrier handling system. The carrier handling system is integrated with an assembly handling system of the production assembly line to populate the micro devices on to the micro device products. The system substantially solves all the problems which previously faced such systems.

The present invention further provides a micro device processing system with a plurality of feeder/processing/buffer systems and a carrier handling system. The feeder/processing/buffer system has a flexible feeder mechanism for receiving micro devices in a number of different manners, a processing mechanism for performing a processing operation on the micro devices at a high rate of speed, and a buffer mechanism for providing the processed micro devices to the carrier handling system. The system substantially solves all the problems which previously faced such systems.

The present invention further provides a circuit board manufacturing system which includes a production assembly line with a plurality of feeder/programming/buffer systems and a carrier handling system. The feeder/programming/buffer system has a flexible feeder mechanism for receiving unprogrammed device in a number of different manners, a programming mechanism for performing a programming operation on the unprogrammed devices at a high rate of speed, and a buffer mechanism for providing the programmed micro devices to the carrier handling system. The carrier handling system is integrated with an assembly handling system of the production assembly line to populate the programmed devices on to the circuit boards. The system substantially solves all the problems which previously faced such systems.

The present invention further provides an integrated circuit device programming system with a plurality of feeder/programming/buffer systems and a carrier handling system. The feeder/programming/buffer system has a flexible feeder mechanism for receiving unprogrammed devices in a number of different manners, a programming mechanism for performing a programming operation on the unprogrammed devices at a high rate of speed, and a buffer mechanism for providing the programmed devices to the carrier handling system. The system substantially solves all the problems which previously faced such systems.

The present invention further provides a carrier handling system for a plurality of feeder/programming/buffer systems. The carrier handling system carries the feeder/programming/buffer systems and the handling system accepts delivery of programmed programmable devices and stores them to effectively create an inexpensive stand-alone programming system. The system substantially solves all the problems which previously faced such systems.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
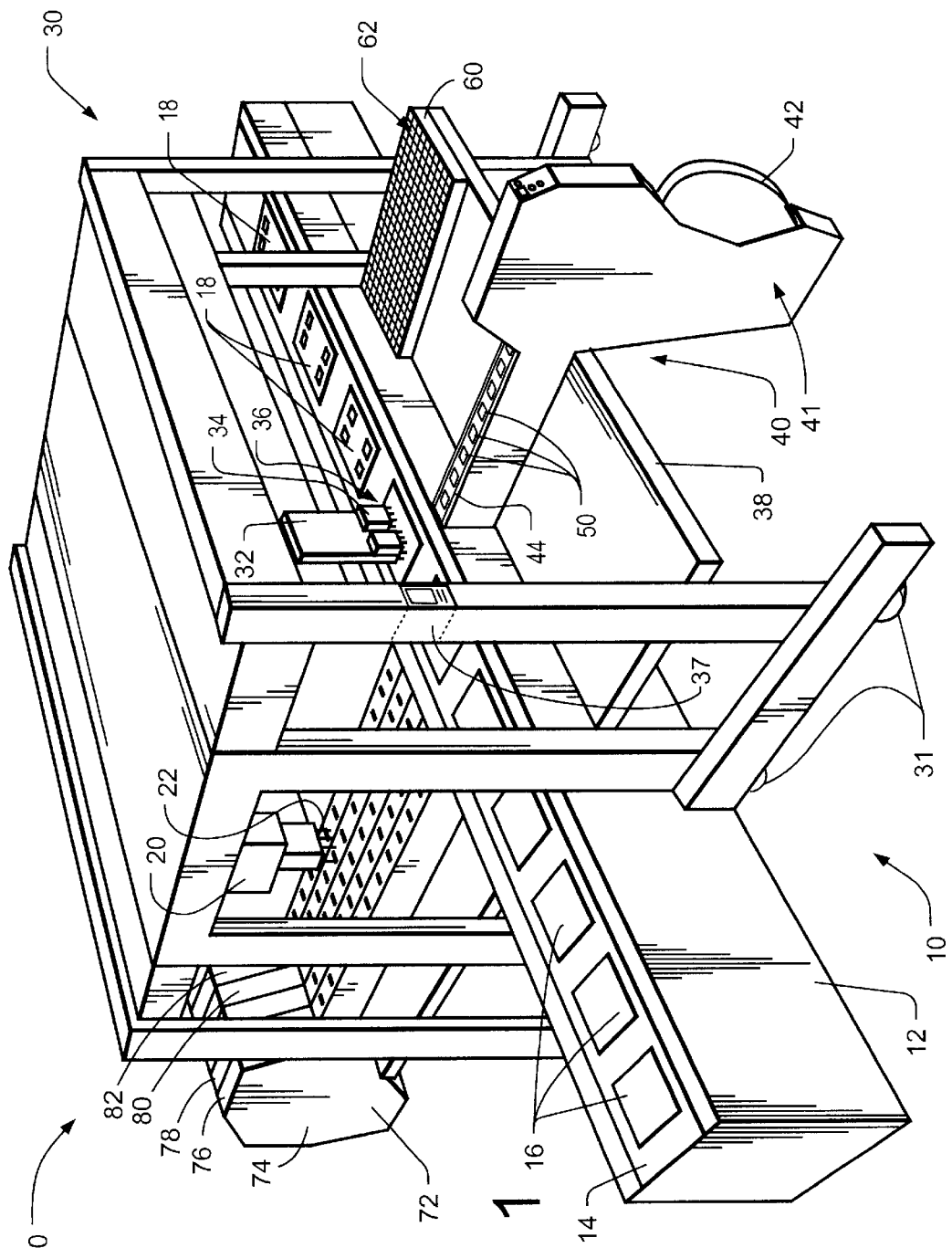
FIG. 1 is a perspective view of the present invention.

Referring now to FIG. 1, therein is shown an isometric view of a circuit board assembly system 10. The circuit board assembly system 10 includes an electronic assembly line 12 having a conveyor 14 upon which unpopulated printed circuit boards 16 are deposited. The conveyor 14 moves the unpopulated printed circuit boards 16 into the electronic assembly line 12 to a position where the unpopulated printed circuit boards 16 are populated by programmable electronic devices (not shown) to form the final printed circuit boards 18. The printed circuit boards 18 are populated by an assembly handling system 20 having a pick-and-place head 22.

A movable carrier system 30 on wheels 31 is placed adjacent to the electronic assembly line 12 and within the handling volume, or handling envelope, that the assembly handling system 20 is capable of moving the programmable electronic devices. The carrier system 30 is used to maintain a reserve supply, or buffer, of programmable devices and includes its own carrier handling system 32 with pick-and-place units 34, which each have a plurality of pick-and-place probes 36. The plurality of pick-and-place probes 36 allow the carrier handling system 32 to handle a number of programmable devices during each movement. The carrier handling system 32 operates under the control of a control system 37. In addition to controlling the carrier handling system 32, the control system 37 is programmable to prevent interference between the carrier handling system 32 and the assembly handling system 20.

The carrier handling system 32 is located over a table 38 which carries a feeder/processing/buffer system 40. The feeder/programming/buffer system 40 is in-line, linear operation system which fits into a feeder bay of the circuit board assembly system 10. The ability to fit the feeder/programmer/buffer system 40 into roughly the same space and location as a conventional feeder (not shown) provides a new circuit board assembly system 10 which is capable of simplified, sustained high-speed processing and assembly operation.

A number of different input mechanisms may be used to feed the input feeder/programmer/buffer system 40 including a tube, tube stacker, tray, tray stacker, or a tape and reel as used with prior art systems. Due to the in-line configuration, the feeder/programmer/buffer system 40 is able to flexibly accommodate different feeding options with minimal changes. In the best mode, the feeder/programmer/buffer system 40 has an input feeder mechanism 41 which is shown as a tape and reel feeder 42. The tape and reel feeder 42 could be placed in a number of different positions but is shown as underneath the feeder/programmer/buffer system 40. Due to the in-line configuration, the feeder/programmer/buffer system 40 is able to flexibly accommodate different feeding options with minimal changes. The tape and reel feeder 42 provides unprogrammed devices (not shown) which are programmed by the feeder/programmer/buffer system 40 and out put on a buffer conveyor 44 as programmed devices 50 which will be under the handling envelope of both the assembly handling system 20 and the carrier handling system 32.

The assembly handling system 32 has a handling envelope which includes a buffer tray or buffer section 60 which can contain programmable devices 62 which comprise a buffer supply of programmed devices. The buffer section 60 is shown as a tray, but it would be understood that it could be any type of area or mechanism from which the assembly line handling 20 can pick up programmable devices 62 to populate the unpopulated printed circuit boards 16.

For high-speed production lines, additional carrier systems such as the carrier system 70 can be added which has a table 72 supporting a plurality of feeder/programming/buffer systems 76, 78, 80 and 82 which are on the opposite side of the electronic assembly line 12 from the carrier system 30.

In operation, unpopulated printed circuit boards 16 would be placed on the conveyor 14 and moved by the electronic assembly line 12 under the assembly handling system 20 which would pickup processed device 50, either sequentially or in batches, from the plurality of feeder/processing/buffer systems 40 and 74 through 82, or the buffer section 60 to populate the printed circuit boards 16 to form the populated printed circuit boards 18.

When the main electronic assembly line 12 is stopped, the carrier system 30 could continue to use the carrier handling system 32 to pick-and-place processed devices 50 and place them in the buffer section 60 to form the programmed programmable devices 62 to build up a reserve.

When the circuit board assembly system 10 is operating at high-speed, the assembly handling system 20 takes programmed devices from the buffer section 60 to populate the printed circuit boards 16 at an even faster rate than the feeder/programming/buffer system 40 can replenish the buffer section 60.

When the circuit board assembly system 10 is operating at sustained high-speeds, the assembly handling system 20 takes programmed devices from the buffer section 60 to populate the printed circuit boards 16 and the carrier handling system 32 would draw from multiple feeder/programming/buffer systems, such as the feeder/programming/buffer systems 76 through 82, to replenish a buffer section 64 (shown in FIG. 3) for those systems.

As would be evident to those skilled in the art, the carrier system 30 can be used as a programmed device supply system. It can be moved on the wheels 31 to be used with a number of feeder/programming/buffer systems to build up a buffer supply of programmed devices 62 in a separate area from the electronic assembly line 12. The carrier system 30 is totally self-contained so as to be able to produce processed devices 50 away from the electronic assembly line 12. As would be evident to those skilled in the art, since robotic handling systems are used herein, only minor modifications or additional equipment are required have the buffer section 60 be a tray, a tray stacker, a tube, a tube stacker, or a tape and reel. In the preferred embodiment, the buffer section 60 would be a tray stacker which would be filled and separately taken over to the feeder bay of the electronic assembly line 12 so the assembly handling system 20 could use the tray as a feeder tray from which to pick-and-place programmed electronic devices onto the unpopulated printed circuit boards 16.

Further, it should be noted that the system is capable of handling a plurality of different devices of different shapes and sizes and would be capable of picking and placing processed devices 50 in such an arrangement that the sequence of components in the buffer section 60 would be in an optimal organization for use by the electronic assembly line 12.

Figure 2:
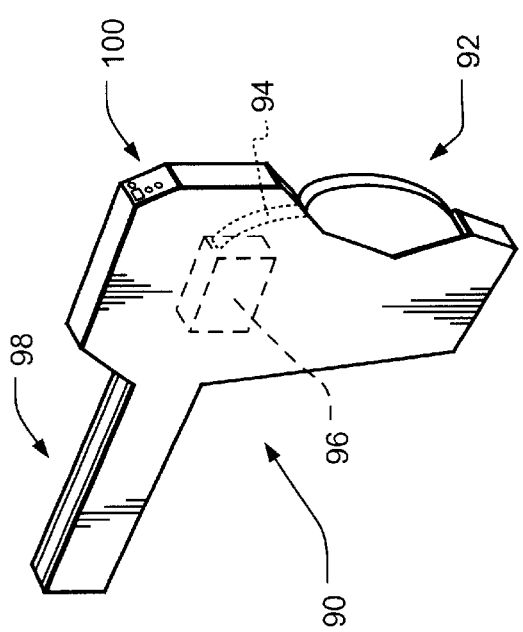
FIG. 2 is an isometric view of a feeder/processing system of the present invention.

Referring now to FIG. 2, therein is shown an isometric of a typical feeder/programming/buffer system 90. The feeder/programming/buffer system 90 is made up of a feeder mechanism 92 containing a plurality of unprogrammed electronic devices tape 94. The tape provides the unprogrammed devices, a programming mechanism 96 programs the programmable devices, and then the programmed devices are placed on a output buffer mechanism 98 under the control of a control system 100. The output buffer mechanism 98 assures that the programmed devices are supplied as required by any system requiring the programmed devices. The operation of the feeder/programming/buffer system 90 is shown in greater detail in the co-pending application to Bolotin, supra.

Figure 3:
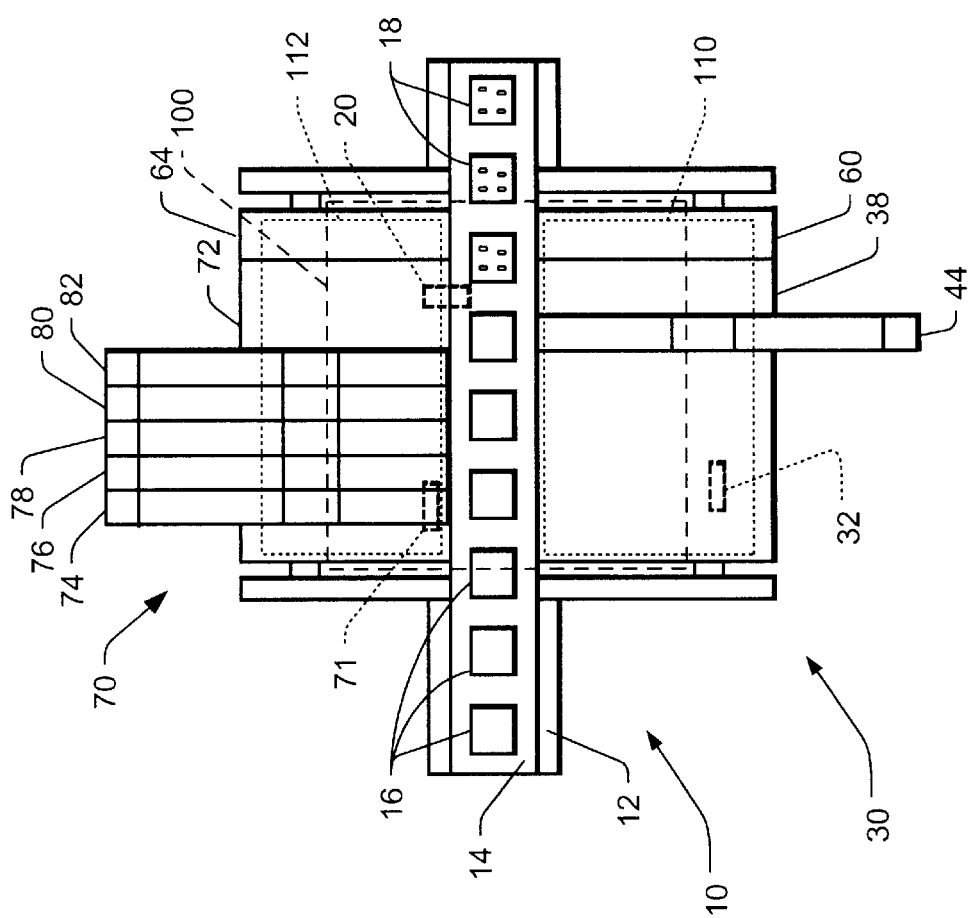
FIG. 3 is a top view of the present invention with the top removed.

Referring now to FIG. 3, therein is shown a top view of the circuit board assembly system 10 with the top removed. All the parts that are the same as shown in FIG. 1 have the same nomenclature and number in FIG. 3. Just as the carrier system 70 has a carrier handling system 32, the carrier system 70 has a carrier handling system 71.

In FIG. 3, the assembly handling system 20 has an assembly handling envelope 100, the carrier handling system 32 has a carrier handling envelope 110, and the carrier system 70 has a carrier handling envelope 112. As shown, the assembly handling system 20 can pick parts either directly from the feeder/programming/buffer systems 40 or 70, or from buffer sections 60 or 64. The carrier handling systems 32 and 71 can pick programmed devices from the feeder/programming/buffer systems 40 or 70, respectively, and deposit them in their respective buffer sections 60 or 64.

From the above it will be understood that the present invention is applicable to what can be described as "micro devices". Micro devices include a broad range of electronic and mechanical devices. The best mode describes processing which is programming for programmable devices, which include but are not limited to devices such as Flash memories (Flash), electrically erasable programmable read only memories (E²PROM), programmable logic devices (PLDs), field programmable gate arrays (FPGAs), and microcontrollers. However, the present invention encompasses processing for all electronic, mechanical, hybrid, and other devices which require testing, measurement of device characteristics, calibration, and other processing operations. For example, these types of micro devices would include but not be limited to devices such as microprocessors, integrated circuits (ICs), application specific integrated circuits (ASICs), micro mechanical machines, micro-electro-mechanical (MEMs) devices, micro modules, and fluidic systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A micro device product manufacturing system comprising:
    a production assembly line capable of providing a product ready for incorporation of a processed micro device;
    a feeder mechanism capable of providing an unprocessed micro device;
    a processing mechanism capable of receiving the unprocessed micro device from the feeder mechanism and processing the unprocessed micro device to produce a processed micro device;
    a buffer mechanism capable of receiving the processed micro device from the processing mechanism and outputting the processed micro device;
    a buffer section for storing the processed micro device;
    a carrier system capable of taking the processed micro device from the buffer mechanism and providing the processed micro device to the buffer section; and
    a handling system capable of taking the processed micro device from the buffer section and incorporating the processed micro device into the product.

2. The micro device product manufacturing system as claimed in claim 1 wherein:
    the production assembly line, the feeder, processing, and buffer mechanisms, the carrier system, and the handling system are connected.

3. The micro device product manufacturing system as claimed in claim 1 wherein:
    the feeder mechanism is capable of providing the unprocessed micro device in a feeder selected from a group consisting of a tray, tray stacker, tube, tube stacker, and tape and reel; and
    the buffer section is capable of storing the processed micro device in a container selected from a group consisting of a tray, tray stacker, tube, tube stacker, and tape and reel.

4. The micro device product manufacturing system as claimed in claim 1 wherein:
    the processing mechanism processes the unprocessed micro device with a process selected from a group consisting of programming, calibration, test, and measurement.

5. The micro device product manufacturing system as claimed in claim 1 wherein:
    the processing mechanism processes a plurality of unprocessed micro devices simultaneously.

6. The micro device product manufacturing system as claimed in claim 1 wherein:
    the carrier system includes a carrier handling system for moving a plurality of processed micro devices from the buffer mechanism simultaneously to the buffer section.

7. The micro device product manufacturing system as claimed in claim 1 including:
    a plurality of feeder mechanisms capable of providing unprocessed micro devices;
    a plurality of processing mechanisms capable of receiving the unprocessed micro devices from the plurality of feeder mechanisms and processing the unprocessed micro devices to produce processed micro devices;
    a plurality of buffer mechanisms capable of receiving the processed micro devices from the plurality of processing mechanisms and outputting the plurality of processed micro devices;
    a buffer section for storing processed micro devices; and
    the carrier system includes a carrier handling system capable of picking up the processed micro devices from the plurality of buffer mechanisms and providing the processed micro devices to the buffer section.

8. The micro device product manufacturing system as claimed in claim 1 wherein:
    the carrier system has a carrier handling system with a handling envelope covering the buffer mechanism and the buffer section; and
    the handling system has a handling envelope covering a portion of the handling envelope of the carrier handling system including the buffer section.

9. A micro device supply system comprising:
    a feeder mechanism capable of providing an unprocessed micro device;
    a processing mechanism capable of receiving the unprocessed micro device from the feeder mechanism and processing the unprocessed micro device to produce a processed micro device;
    a buffer mechanism capable of receiving the processed micro device from the processing mechanism and providing the processed micro device as required to the production assembly line;
    a buffer section for storing the processed micro device; and
    a carrier system capable of taking the processed micro device from the buffer mechanism and providing the processed micro device to the buffer section.

10. The micro device supply system as claimed in claim 9 wherein:
    the feeder, processing, and buffer mechanisms, and the carrier system alone are connected.

11. The micro device supply system as claimed in claim 9 wherein:
    the feeder mechanism is capable of providing an unprocessed micro device in a feeder selected from a group consisting of a tray, tray stacker, tube, tube stacker, and tape and reel; and
    the buffer section is capable of storing the processed micro device in a container selected from a group consisting of a tray, tray stacker, tube, tube stacker, and tape and reel.

12. The micro device supply system as claimed in claim 9 wherein:

the processing mechanism processes the unprocessed micro device with a process selected from a group consisting of programming, calibration, test, and measurement.

13. The micro device supply system as claimed in claim 9 wherein:

the processing mechanism processes a plurality of unprocessed micro devices simultaneously.

14. The micro device supply system as claimed in claim 9 wherein:

the carrier system includes a carrier handling system for moving a plurality of processed micro devices from the buffer mechanism simultaneously to the buffer section.

15. The micro device supply system as claimed in claim 9 including:

a plurality of feeder mechanisms capable of providing unprocessed micro devices;

a plurality of processing mechanisms capable of receiving the unprocessed micro devices from the plurality of feeder mechanisms and processing the unprocessed micro devices to produce processed micro devices;

a plurality of buffer mechanisms capable of receiving the processed micro devices from the plurality of processing mechanisms and outputting the plurality of processed micro devices;

a buffer section for storing processed micro devices; and the carrier system capable of taking the processed micro devices from the plurality of buffer mechanisms and providing the processed micro devices to the buffer section.

16. The micro device supply system as claimed in claim 9 wherein:

the carrier system has a carrier handling system with a handling envelope covering the buffer mechanism and the buffer section.

17. A circuit board assembly system comprising:

a production assembly line capable of providing a circuit board ready for incorporation of a programmed electronic device;

a feeder mechanism capable of providing an unprogrammed electronic device;

a programming mechanism capable of receiving the unprogrammed electronic device from the feeder mechanism and programming the unprogrammed electronic device to produce a programmed electronic device;

a buffer mechanism capable of receiving the programmed electronic device from the programming mechanism and outputting the programmed electronic device;

a buffer section for storing the programmed electronic device;

a carrier system capable of taking the programmed electronic device from the buffer mechanism and providing the programmed electronic device to the buffer section; and a handling system capable of taking the programmed electronic device from the buffer section and incorporating the programmed electronic device onto the circuit board.

18. The circuit board assembly system as claimed in claim 17 wherein:

the production assembly line, the feeder, programming, and buffer mechanisms, the carrier system, and the handling system are connected.

19. The circuit board assembly system as claimed in claim 17 wherein:

the feeder mechanism is capable of providing an unprogrammed electronic device in a feeder selected from a group consisting of a tray, tray stacker, tube, tube stacker, and tape and reel; and the buffer section is capable of storing the programmed electronic devices in container selected from a group consisting of a tray, tray stacker, tube, tube stacker, and tape and reel.

20. The circuit board assembly system as claimed in claim 17 wherein:

the programming mechanism programs a plurality of unprogrammed electronic devices simultaneously.

21. The circuit board assembly system as claimed in claim 17 wherein:

the carrier system includes a carrier handling system for sequentially picking up a plurality of programmed electronic devices and moving the plurality of programmed electronic devices simultaneously to the buffer section.

22. The circuit board assembly system as claimed in claim 17 including:

a plurality of feeder mechanisms capable of providing unprogrammed electronic devices;

a plurality of programming mechanisms capable of receiving the unprogrammed electronic devices from the plurality of feeder mechanisms and programming the unprogrammed electronic devices to produce programmed electronic devices;

a plurality of buffer mechanisms capable of receiving the programmed electronic devices from the plurality of programming mechanisms and outputting the plurality of programmed electronic devices;

a buffer section for storing programmed electronic devices; and the carrier system capable of sequentially taking the programmed electronic devices from the plurality of buffer mechanisms and providing the programmed electronic devices to the buffer section.

23. The circuit board assembly system as claimed in claim 17 wherein:

the carrier system has a carrier handling system with a handling envelope covering the buffer mechanism and the buffer section; and the handling system has a handling envelope covering a portion of the handling envelope of the carrier handling system including the buffer section.

24. A electronic device supply system comprising:

a feeder mechanism capable of providing an unprogrammed electronic device;

a programming mechanism capable of receiving the unprogrammed electronic device from the feeder mechanism and programming the unprogrammed electronic device to produce a programmed electronic device; and a buffer mechanism capable of receiving the programmed electronic device from the programming mechanism and providing the programmed electronic device as required to the production assembly line;

a buffer section for storing the programmed electronic device; and a carrier system capable of taking the programmed electronic device from the buffer mechanism and providing the programmed electronic device to the buffer section.

25. The electronic device supply system as claimed in claim 24 wherein:

the feeder, programming, and buffer mechanisms, and the carrier system alone are connected.

26. The electronic device supply system as claimed in claim 24 wherein:

the feeder mechanism is capable of providing an unprogrammed electronic device in a feeder selected from a group consisting of a tray, tray stacker, tube, tube stacker, and tape and reel; and the buffer section is capable of storing the programmed electronic device in a container selected from a group consisting of a tray, tray stacker, tube, tube stacker, and tape and reel.

27. The electronic device supply system as claimed in claim 24 wherein:

the programming mechanism processes a plurality of unprogrammed electronic.

28. The electronic device supply system as claimed in claim 24 wherein:

the carrier system includes a carrier handling system for moving a plurality of programmed electronic devices from the buffer mechanism simultaneously to the buffer section.

29. The electronic device supply system as claimed in claim 24 including:

a plurality of feeder mechanisms capable of providing unprogrammed electronic devices;

a plurality of programming mechanisms capable of receiving the unprogrammed electronic devices from the plurality of feeder mechanisms and programming the unprogrammed electronic devices to produce programmed electronic devices;

a plurality of buffer mechanisms capable of receiving the programmed electronic devices from the plurality of programming mechanisms and outputting the plurality of programmed electronic devices;

a buffer section for storing programmed electronic devices; and the carrier system capable of taking the programmed electronic devices from the plurality of buffer mechanisms and providing the programmed electronic devices to the buffer section.

30. The electronic device supply system as claimed in claim 24 including:

the carrier system has a carrier handling system with a handling envelope covering the buffer mechanism and the buffer section.

* * * * *